April 11, 1961 A. BLAIN 2,978,800

MEMORY PLANE WIRING TECHNIQUES

Filed Nov. 30, 1955

INVENTOR

ALBERT BLAIN

BY Charles C. English

AGENT

United States Patent Office 2,978,800

Patented Apr. 11, 1961

2,978,800

MEMORY PLANE WIRING TECHNIQUES

Albert Blain, Philadelphia, Pa., assignor to Sperry Rand Corporation, New York, N.Y., a corporation of Delaware Filed Nov. 30, 1955, Ser. No. 549,924

3 Claims. (Cl. 29—203)

The present invention relates to an improved method and apparatus for the assembling and wiring of electrical circuit boards; and is more particularly concerned with improved wiring techniques adapted to permit the more rapid wiring of a magnetic memory plane to a printed circuit board so as to permit dip-soldering of the assembled plane to the board.

In various forms of circuit structures, for instance those employed in digital or other computer devices, the circuits themselves are mounted on plural boards which are later interconnected to provide an operative system. The individual circuit boards so utilized may comprise an insulating material, and may have printed circuits thereon; and it is often required that other circuit components be somehow connected to these printed circuit portions or to terminal structures on the board. The wiring problem thus resulting is often substantial; and this is especially the case when relatively large numbers of components or leads must be conductively attached to the board.

In the case of information storage devices, such as those comprising a plurality of magnetic memory elements associated with control lines, it may in fact be necessary to connect many hundreds of leads to a single circuit board; and in the past this wiring, for instance of a memory plane to a printed circuit board, has comprised the steps of twisting and soldering individual wires around individual terminals carried by the board. Due to the large numbers of connections which must be so made, this known wiring operation has been very tedious, and has in fact been rather expensive, due to the many hours of time necessitated by the wiring steps. In addition, due to the wiring techniques employed heretofore, it has been required that circuit boards, for instance printed circuit boards, be provided with many hundreds of terminals adapted to receive conductor elements; and the circuit boards themselves have thus been very expensive.

The present invention serves to obviate the foregoing difficulties and disadvantages of wiring techniques employed heretofore, particularly in the case of the wiring of a magnetic memory plane to a printed circuit board, and contemplates the provision of an improved circuit board having a plurality of apertures therein whereby individual conductor elements may be forced into the said apertures and the overall board may thereafter be dip-soldered to retain the assembled circuits on the board. The invention further contemplates an improved wiring device permitting a large plurality of the said conductor elements to be simultaneously inserted into the aforementioned board apertures whereby the said conductor elements may be simultaneously attached to the board; and these elements may thereafter be simultaneously dip-soldered, thereby to eliminate the laborious and costly individual wiring and soldering techniques utilized in the past.

It is accordingly an object of the present invention to provide an improved method and apparatus for attaching plural conductor elements to a circuit board.

A further object of the present invention resides in the provision of an improved method and apparatus for assembling and wiring a magnetic memory plane to a printed circuit board.

Another object of the present invention resides in an improved method and apparatus for quickly and securely attaching circuit components to a supporting board structure.

A still further object of the present invention resides in the provision of an improved method and apparatus for rapidly attaching a large plurality of conductor elements to a circuit board, thereby to permit the simultaneous dip-soldering of these components to the board.

Still another object of the present invention resides in the provision of an improved wiring device adapted to permit the simultaneous insertion of plural conductor elements into a supporting board structure.

A still further object of the present invention resides in the provision of a method and apparatus for the wiring of circuit boards more rapidly and with less expense than has been the case heretofore.

In providing for the foregoing objects and advantages, the present invention contemplates the provision of a wiring machine having a table upon which a printed circuit board may be placed. The said printed circuit board defines a plurality of apertures or holes, and these apertures or holes in the board are aligned with corresponding apertures or holes in the said table of the wiring machine. The wiring machine further includes a plurality of needle-like members disposed adjacent the aforementioned apertures in the circuit board and table, and in alignment therewith; and these needle-like members are adapted to be simultaneously forced into the aligned apertures in the board and table.

In practice, therefore, wiring may be accomplished through the use of the improved wiring machine, to be described, by causing a plurality of conductor elements to be disposed adjacent one side of the circuit board in overlying relationship to the apertures in the said board; and the said needle-like members may then be caused to pass through the aligned apertures in the board and table, thereby to carry portions of the said conductor elements from one side of the board toward the other side of the board. This method and apparatus thus causes conductor element portions to be simultaneously inserted into a large plurality of apertures in the board; and the insertion technique is such that the conductor elements are caused to be temporarily or permanently retained in the board apertures.

The board, with its inserted conductors, may thereafter be removed from the wiring machine and dip-soldered, whereby the inserted conductor elements are permanently attached to the board and are electrically connected, for instance to printed circuits communicating with the aforementioned board apertures. The invention thus permits large numbers of conductor elements to be simultaneously affixed to a supporting board structure thereby eliminating the individual wiring attachment required heretofore. The invention, in addition, permits the use of a highly simplified board structure whereby the wiring method and the resultant wired circuit is effected more rapidly and with considerably less expense than has been the case in the past.

The foregoing objects, advantages, construction and operation of the present invention will become more readily apparent from the following description and accompanying drawings, in which.

Figure 1:
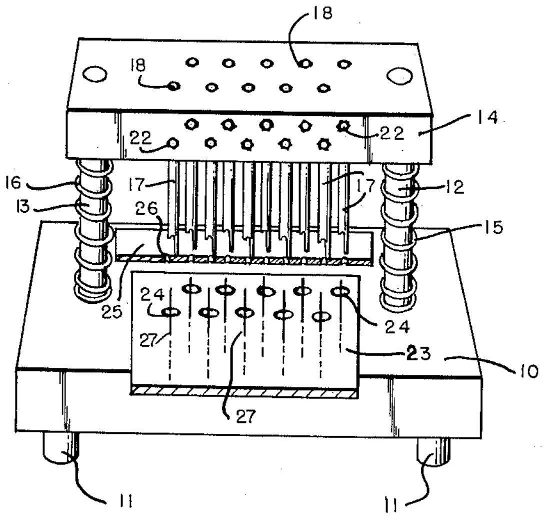
Figure 1 is an illustration of a simple wiring machine constructed in accordance with one embodiment of the present invention.

Referring now to Figure 1, it will be seen that in accordance with the present invention, a wiring machine may comprise a table 10 supported by legs 11 and having a pair of spaced pillars 12 and 13 thereon. The upper ends of the said pillars 12 and 13 are fixedly attached to a cross-member 14, while the lower ends of the said pillars 12 and 13 are slidably disposed within bores defined in the table 10. Thus, it will be seen that the cross-member 14 may be selectively urged toward the table 10 by applying a downward force to the said cross-member 14 whereby pillars 12 and 13 slide downwardly in the bores defined in table 10.

In practice, a pair of spring members 15 and 16 are carried by the pillars 12 and 13 respectively, and the upper and lower ends of the said spring members 15 and 16 impinge respectively upon the underside of cross-member 14, and upon the upper side of table 10 whereby cross-member 14 is resiliently maintained at a position away from table 10. Downward forces applied to cross-member 14 will, therefore, cause the said cross-member 14 to be urged toward table 10 thereby to compress springs 15 and 16; and upon release of the said downward force, the said cross-member 14 will be returned to its initial position, by action of springs 15 and 16.

Cross-member 14 carries a plurality of needle-like members 17, and these needle-like members are disposed in staggered relationship to one another within bores 18 defined in cross-member 14. The particular construction of the needle-like members may be more readily seen from an examination of Figures 2A through 2C, and these needle-like members, in accordance with one embodiment of the present invention, comprise a downwardly extending pilot portion 19 and a shorter downwardly extending portion 20 in combination with a hooked recess 21 between the portions 19 and 20. The arrangement, therefore, is such that upon depression of cross-member 14, the needles 17 are urged toward table 10 and the design of the needles is such that conductor elements may be selectively caught by the several hook portions 21 of the needles 17 thereby to carry these conductor elements with the needles in their downward movement.

It must be understood that the particular configuration of needle elements 17 shown in Figures 1 and 2, is illustrative only and that variations in the needle design can be made and may in fact be desired with variations in the circuit structure being wired. To provide this interchangeability of needles, the cross-member 14 includes a plurality of transverse locking screws 22.

In the wiring of a circuit board, by the wiring device illustrated in Figure 1, the board selected, such as 23, may define a plurality of holes or apertures 24, the configuration and disposition of which corresponds to that of the needles 17; and the table 10 may define a plurality of further bores (not shown) disposed in corresponding relationship to the several apertures 24 in the circuit board 23, as well as in corresponding relation to the several needle members 17. If desired, the table 10 may further carry an aligning structure 25, comprising an elongated bar having a plurality of edge slots 26 adapted to temporarily retain the terminal edge of a conductor element in overlying relationship to the apertures 24 in board 23, as well as to the corresponding apertures in board 10 below the needle-like elements 17. It should be noted that when an aligning structure, such as 25, is in fact provided, the pilot portions 19 of the needle members 17 may be dispensed with, whereby the hook portion 21 is defined between two downwardly extending needle portions of substantially the same length.

In practice, the board member 23 may be placed upon table 10 with the several apertures 24 in alignment with the corresponding apertures or bores in table 10. A plurality of conductor elements 27 may then be aligned adjacent one side of the board 23 in overlying relationship to the several apertures 24; and this alignment may be effected by causing terminal ends of the conductor elements 27 to be inserted into the edge slots 26 of the aligning structure 25; or by causing the cross-member 14 to be partially depressed whereby the pilot portions 19 of the needles 17 are inserted into the apertures 24 of the board 23 so that the conductor elements 27 may be caused to rest against the said pilot portions 19. In practice, it has been found that the alignment step may be performed very quickly by causing the said conductors 27 to extend on board 23 in the vicinity of apertures 24, whereafter a brush-like member can be utilized to sweep across the several conductor elements, thereby causing all of the elements to impinge upon the pilot portions 19 of the needles 17, or to fall into the edge slots 26 of the aligning structures 25.

When the conductor elements 23 are so aligned, a downward force may be applied to the cross-member 14 thereby causing simultaneous depression of all the needles 17 into the apertures 24 of board 23, and thereafter into the aligned apertures provided in table 10; and this simultaneous downward movement of the needle members 17 causes portions of the conductor elements 27 to be carried by the needle members into their corresponding apertures toward the other side of the board 23. Thus, once the conductor elements 27 are aligned in the foregoing manner, a single depression of cross-member 14 causes a simultaneous insertion of portions of these conductor elements into the several apertures 24 defined in board 23.

Figure 2A:
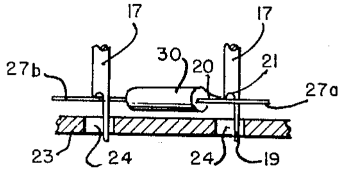
Figures 2A, 2B and 2C, illustrate the operation of the wiring machine shown in Figure 1.
Figure 2B:
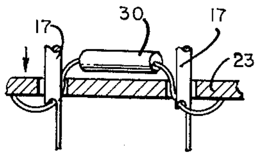
Figure 2C:
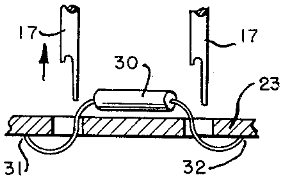

The actual functioning of the needle members 17 during the attachment of conductor elements 27 to the board 23 will be more readily appreciated from Figures 2A through 2C inclusive; and inasmuch as the techniques to be described may also be utilized in attaching separate circuit components to a supporting board, such as a printed circuit board, this latter technique has been shown in Figures 2A through 2C.

Thus, referring to Figure 2A, it will be seen that a component 30 may have a pair of leads **27*a* and 27*b*, and these leads may be caused to overlie the aforementioned apertures 24 in board 23. The needle members 17 may initially be in a position, as shown in Figure 2A, wherein the pilot members 19 of the said needles 17 extend partially into the apertures 24 and the leads 27*a* and 27*b* may be aligned adjacent apertures 24 by causing the said leads to rest against the pilot members 19 of the needles 17. The needles 17 may then be depressed (Figure 2B) whereby the leads of the component 30 are caught in the hook portions 21 of the needles 17 and are carried through the apertures 24 of board 23 toward the other side of the said board. When terminal ends of the leads 27*a* and 27*b* (or of conductors 27 in Figure 1) are disposed adjacent the apertures 24, the downward movement of needles 17 will cause these terminal ends of the conductors or leads to be resiliently forced through the apertures 24 (assuming, of course, that said conductors or leads comprise resilient material) whereby, upon release of cross-member 14 and the corresponding upward movement of needles 17 (Figure 2C), the terminal ends 31 and 32 of the leads attached to component 30 will spring outward and will bear upon the undersurface of board 23, thereby retaining the component 30** on the board.

It will be appreciated that the description thus given in reference to Figures 2A through 2C applies with equal force to the operation of the board structure shown in Figure 1; and that plural conductor elements 27, for instance of the type comprising a magnetic memory plane, may be similarly forced through the several board apertures and caused to impinge upon the underside of the board so as to be retained. The temporarily attached conductors or components so resulting may thereafter be permanently affixed to the board structures 23 by dip-soldering techniques.

The description thus far given has assumed that the needle members 17 are so moved that the several conductors are physically pushed through their corresponding board apertures. By appropriaate change in the structure shown in Figure 1, however, the several needle members may be caused to initially extend through the board member whereby the said needle members may be caused to pull conductor elements through the board rather than pushing them through the said board.

Figure 3A:
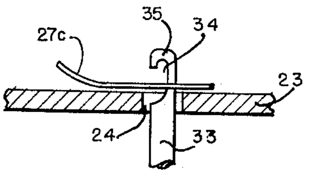
Figures 3A and 3B illustrate the operation of a modified form of wiring machine, in accordance with the present invention.
Figure 3B:
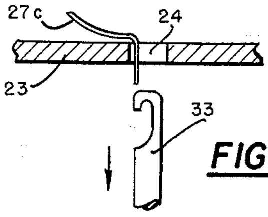

Such an alternative configuration is shown in Figures 3A and 3B; and it will be seen that, as before, a board 23 having apertures such as 24 therein, may be provided with a plurality of conductor elements **27*c* adjacent one side of the board, and in overlying relationship to the several apertures 24. The needle-like members used for the wiring of the board may, in accordance with this modified form of the invention, take the form of an upwardly extending needle 33 defining a notch 34 and hook 35; and it will be seen that downward movement of the needle 33 will, as before, carry a portion of conductor 27*c*** through the aperture, this time by a pulling rather than by a pushing operation (see Figure 3B).

Figure 4A:
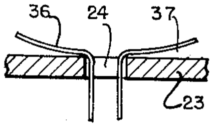
Figures 4A, 4B and 4C illustrate still further modified wiring techniques which may be practiced in accordance with the present invention.
Figure 4B:
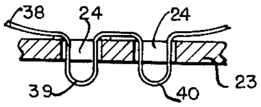
Figure 4C:
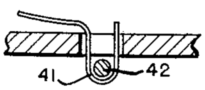

Still other wiring techniques may be performed by the present invention. Thus, referring to Figure 4A, it will be seen that plural leads, such as 36 and 37, may be caused to extend through a single aperture 24 in the board 23 by a pulling or pushing technique of the type described. Similarly, while the foregoing discussion has been predicated upon the alignment of a terminal conductor portion adjacent the several apertures, this alignment may in fact be such that an intermediate portion of the conductor is disposed adjacent one or more of the apertures 24 in the board 23. The pushing or pulling techniques described may thereby cause a conductor, such as 38, to be inserted in one or more of the apertures 24 as a series of continuous loops, such as 39 and 40. This looped configuration lends itself to still further wiring techniques; and, as shown in Figure 4C, for instance, once a single loop, such as 41, is formed, a further wire 42 may be threaded through the loop thereby to provide still another electrical connection. In each of the foregoing modified forms of the invention, moreover, the major advantages described previously are present, in that a simplified board construction may be utilized, and in that plural conductors may be rapidly attached to this board by a simultaneous pushing or pulling of conductor portions through the several board apertures. In addition, by dip-soldering a board assembled by the aforedescribed wiring techniques, a large number of permanent connections may be effected to the board quickly and inexpensively.

While I have described preferred embodiments of the present invention, many variations will be suggested to those skilled in the art, and certain of these variations have already been discussed. Still further modifications will be apparent, however, and the foregoing description is therefore meant to be illustrative only and should not be considered limitative of my invention. All such modifications as are in accord with the principles described, are meant to fall within the scope of the appended claims.

Having thus described my invention, I claim:

1. In a wiring apparatus, support means having a surface adapted to support both a circuit board having a plurality of apertures and conductor members to be wired on said board, shaft means extending substantially perpendicular to said surface of said support means, an elongated bar engaging said shaft means, said shaft means being slidable relative to either said support means or said elongataed bar whereby the position of said elongated bar may be changed relative to the position of said support means under the guidance of said shaft means, helical spring means surrounding said shaft means between said support means and elongataed bar for resiliently positioning said support means and bar relative to one another, and needle means extending from said elongated bar toward said support means, said needle means including hook portions remote from said elongated bar adapted to engage said conductor members to change the position of portions of said conductor members relative to said circuit board upon change in position of said elongated bar relative to said support means, said support means surface having a plurality of apertures therethrough complementary in location to the location of said needles on said elongated bar so as to receive said needles and the engaged conductor members when said apertures on said circuit board are aligned with respect to those of said support means and upon relative change of position of said elongated bar and support means, whereby said relative change of position initiates assembly of said conductor members on said circuit board.

2. In a wiring apparatus, the combination as recited in claim 1 wherein said needle means include guide portions at the hooked portion ends thereof to insure alignment of said needles and apertures.

3. In a wiring apparatus, the combination as recited in claim 1 and further comprising alignment means adjacent said support means adapted to align relative to the apertures of a circuit board a plurality of conductors to be inserted in said circuit board.

References Cited in the file of this patent

UNITED STATES PATENTS

| | | |
|---|---|---|
| 822,213 | Marshall | May 29, 1906 |
| 1,367,504 | Rolle | Feb. 1, 1921 |
| 1,813,839 | Capell | July 7, 1931 |
| 2,063,918 | Flood | Dec. 15, 1936 |
| 2,163,716 | Turner | June 27, 1939 |
| 2,260,365 | Charmoy | Oct. 28, 1941 |
| 2,304,301 | Carfagno | Dec. 8, 1942 |
| 2,304,927 | Kane | Dec. 15, 1942 |
| 2,341,184 | McCann | Feb. 8, 1944 |
| 2,358,745 | Stieglitz | Sept. 19, 1944 |
| 2,584,231 | Schmidt | Feb. 5, 1952 |
| 2,657,454 | Huyett | Nov. 3, 1953 |
| 2,694,249 | Kapp | Nov. 16, 1954 |
| 2,707,274 | Kough | Apr. 26, 1955 |
| 2,718,625 | Harrison | Sept. 20, 1955 |
| 2,754,486 | Hathorn | July 10, 1956 |